(12) United States Patent
Lin

(10) Patent No.: US 6,418,020 B1
(45) Date of Patent: Jul. 9, 2002

(54) HEAT DISSIPATION DEVICE WITH RIBBED FIN PLATES

(75) Inventor: Ming-Chen Lin, Hsi-Chih (TW)

(73) Assignee: Advanced Thermal Technologies (TW)

( * ) Notice: Subject to any disclaimer, the term of this patent is extended or adjusted under 35 U.S.C. 154(b) by 0 days.

(21) Appl. No.: 09/822,597

(22) Filed: Mar. 30, 2001

(51) Int. Cl.[7] ............................................... H05K 7/20
(52) U.S. Cl. ................. 361/703; 361/704; 361/709; 361/710; 257/722; 174/16.3; 165/80.3
(58) Field of Search ............................. 361/703, 704, 361/707, 709, 710, 718, 719; 257/706, 707, 712, 713, 722; 174/16.1, 16.3; 165/80.3, 185

(56) References Cited

U.S. PATENT DOCUMENTS

| | | | |
|---|---|---|---|
| 4,682,651 A | * 7/1987 | Gabuzda | 165/80.3 |
| 4,715,438 A | * 12/1987 | Gabuzda et al. | 165/185 |
| 4,753,290 A | * 6/1988 | Gabuzda | 165/185 |
| 5,582,240 A | * 12/1996 | Widmayer | 165/80.3 |
| 5,625,229 A | * 4/1997 | Kojima et al. | 257/712 |
| 5,818,694 A | * 10/1998 | Daikoku et al. | 361/703 |
| 5,946,193 A | * 8/1999 | Hendrix et al. | 361/704 |
| 6,015,008 A | * 1/2000 | Kogure et al. | 165/185 |
| 6,263,955 B1 | * 7/2001 | Azar | 165/80.3 |
| D450,306 S | * 11/2001 | Lin et al. | D13/179 |

* cited by examiner

Primary Examiner—Boris Chervinsky
(74) Attorney, Agent, or Firm—Harness, Dickey & Pierce, P.L.C.

(57) ABSTRACT

A heat dissipation device includes a thermally conductive base plate and a plurality of thermally conductive fin plates that are in thermal communication with the base plate. Each adjacent pair of the fin plates defines a channel therebetween, through which cool air is forced to flow. Each of the fin plates has a proximate side that is proximate to the base plate, a distal side that is opposite to the base plate, and a plurality of integral ribs that extend from the proximate side to the distal side, thereby permitting heat transfer from the proximate side to the distal side along the ribs. In addition, because each of the ribs enables formation of a small turbulent flow of the cool air, a temperature boundary layer of the air is broken in each of the channels, thereby permitting heat transfer from upstream ends of the channels to downstream ends of the channels. Because the sizes of the ribs are relatively small with respect to the widths of the channels, the cool air can flow smoothly through the channels.

20 Claims, 10 Drawing Sheets

HEAT DISSIPATION DEVICE WITH RIBBED FIN PLATES

BACKGROUND OF THE INVENTION

1. Field of the Invention

This invention relates to a device for dissipating heat generated from an electronic device, and more particularly to a heat dissipation device, which is provided with a plurality of ribbed fin plates, thereby increasing the heat dissipating effect thereof.

2. Description of the Related Art

Figure 1:
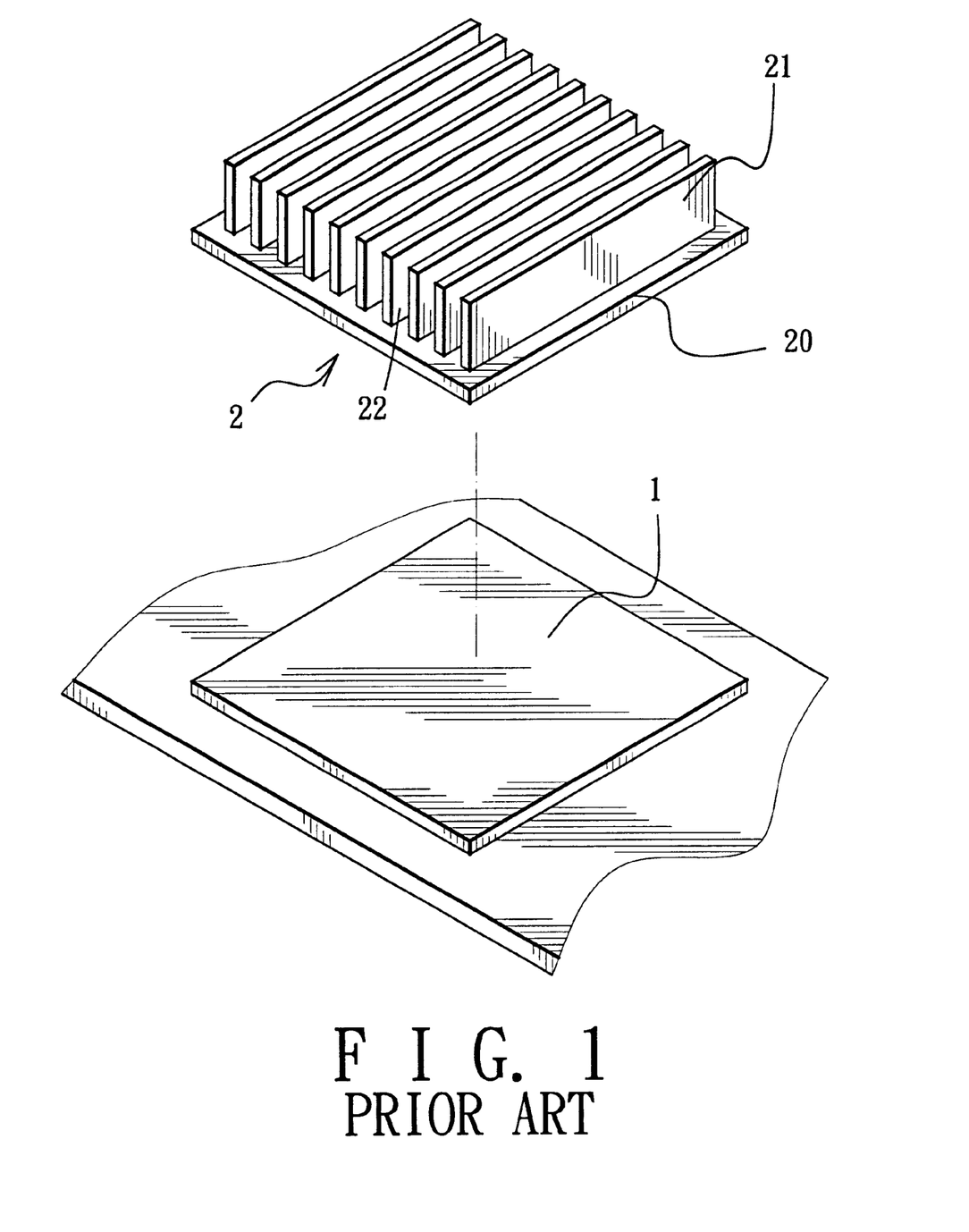
FIG. 1 is a perspective view of a conventional heat dissipation device.
Figure 2:
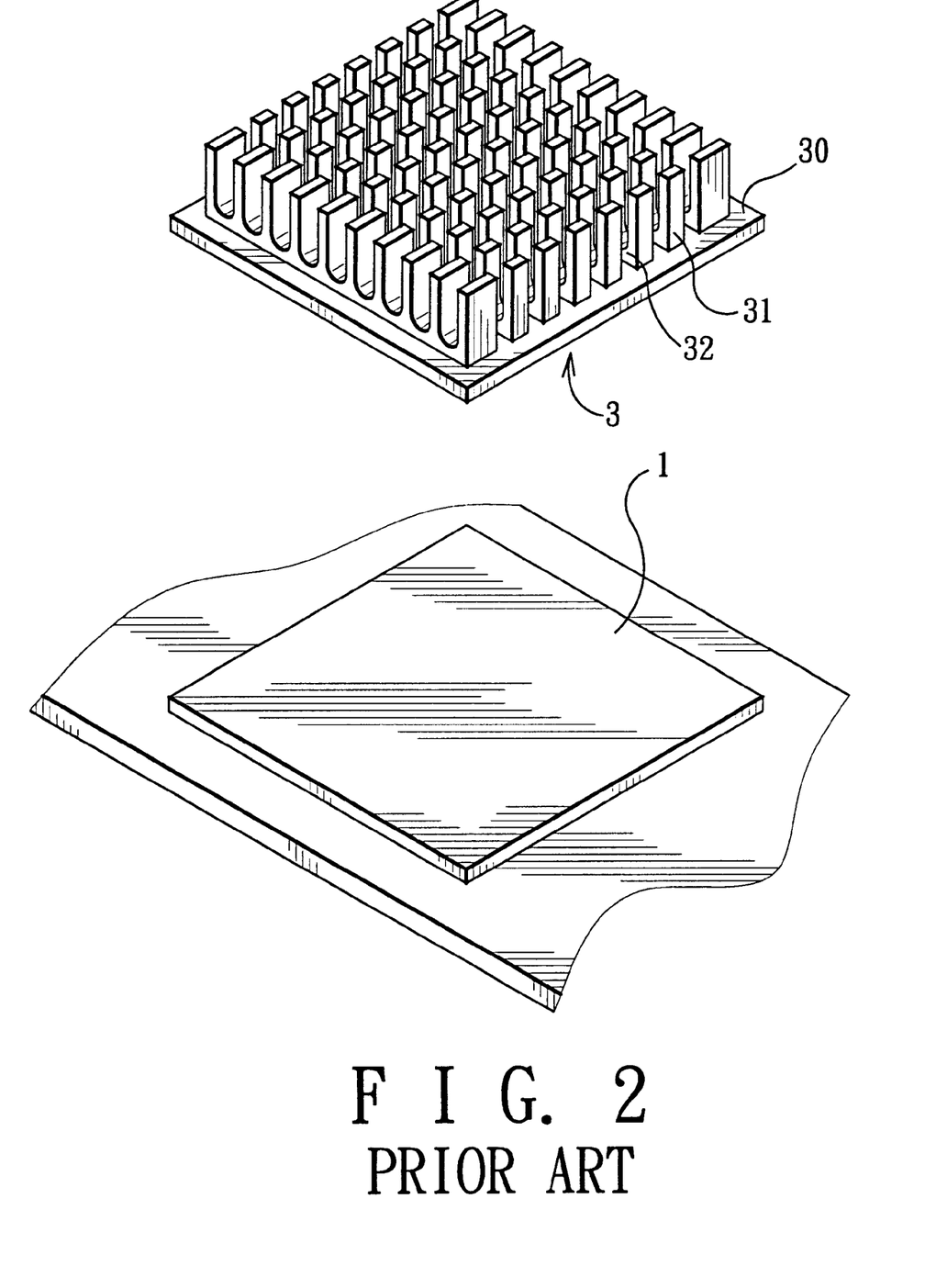
FIG. 2 is a perspective view of another conventional heat dissipation device.

Nowadays, because electronic devices are getting more and more compact, heat quantity generated per unit volume of the devices is on the rise. As a result, there is a need to promote the heat dissipating ability of the electronic device. Referring to FIG. 1, a conventional heat dissipation device 2 is shown to include a thermally conductive horizontal base plate 20 and a plurality of parallel vertical heat-dissipating fin plates 21 that extend integrally and upwardly from the base plate 21 and that have flat side surfaces. The base plate 20 abuts against and is in thermal communication with a heat-generating horizontal plate 1 of an electronic device. Each adjacent pair of the fin plates 21 defines a channel 22 therebetween, through which cool air is forced to flow. As such, during heat conduction in the fin plates 21, heat is concentrated in lower portions thereof, thereby decreasing the heat dissipating effect of top portions of the fin plates 21. Furthermore, when the cool air flows through the channels 22, the thickness of the temperature boundary layer of the air increases from the upstream ends of the channels 22 to the downstream ends of the channels 22, thereby decreasing the heat dissipating effect of the portions of the fin plates 21, which define the downstream portions of the channels 22. Referring to FIG. 2, another conventional heat dissipation 3 is shown to also include a base plate 30 and a plurality of heat-dissipating fin posts 31, which define a grid-shaped channel unit 32 that permits flow of air therethrough. Although heat can be transferred through the posts 31 from lower ends to upper ends, it is difficult to discharge air from the channel unit 32. Because the air cannot carry heat effectively from the base plate 30, the heat dissipating effect is relatively poor.

SUMMARY OF THE INVENTION

An object of this invention is to provide a heat dissipation device with a plurality of ribbed and elongated fin plates, each of which permits heat transfer therein from one end to another end and from one side to another side and which can guide the flow of cool air, thereby increasing the heat dissipating effect.

According to this invention, a heat dissipation device includes a thermally conductive base plate and a plurality of thermally conductive fin plates that are in thermal communication with the base plate. Each adjacent pair of the fin plates defines a channel therebetween, through which cool air is forced to flow. Each of the fin plates has a proximate side that is proximate to the base plate, a distal side that is opposite to the base plate, and a plurality of integral ribs that extend from the proximate side to the distal side, thereby permitting heat transfer from the proximate side to the distal side along the ribs. Because each of the ribs enables formation of a small turbulent flow of the cool air, a temperature boundary layer of the air is broken in each of the channels, thereby permitting heat transfer from upstream ends of the channels to downstream ends of the channels. In addition, because the sizes of the ribs are relatively small with respect to the widths of the channels, the cool air can flow smoothly through the channels.

BRIEF DESCRIPTION OF THE DRAWINGS

These and other features and advantages of this invention will become apparent in the following detailed description of the preferred embodiments of this invention, with reference to the accompanying drawings, in which.

DETAILED DESCRIPTION OF THE PREFERRED EMBODIMENTS

Similar elements and structures are designated by like reference numbers throughout the whole disclosure.

Figure 3:
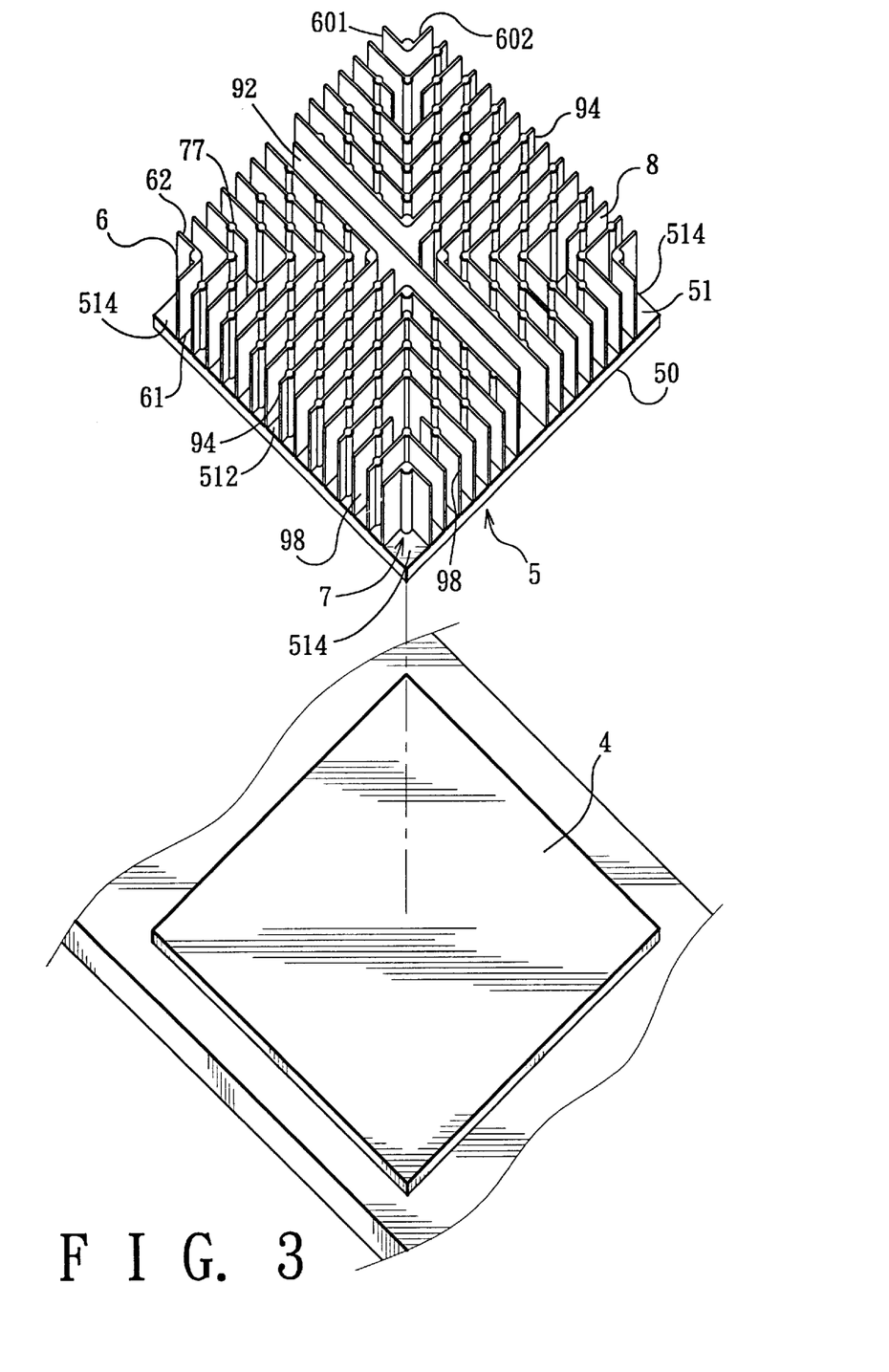
FIG. 3 is a perspective view of a preferred embodiment of a heat dissipation device according to this invention.

Referring to FIG. 3, a preferred embodiment of a heat dissipation device according to this invention is shown to include a thermally conductive horizontal base plate 5, and a plurality of heat-dissipating fin plates 6. The fin plates 6 extend integrally and upwardly from the base plate 5.

The base plate 5 has a heat-accepting side surface 50 that is adapted to abut against a heat generating member 4 of an electronic device and that is adapted to be in thermal communication with the heat generating member 4, and a heat-dissipating side surface 51.

The fin plates 6 extend perpendicularly from the heat-dissipating side surface 51 of the base plate 5, and are in thermal communication with the base plate 5. Each adjacent pair of the fin plates 6 defines a channel 8 therebetween, which is adapted to permit flow of cool air therethrough and which has an upstream end for introduction of the cool air, and a downstream end for discharge of the cool air. Each of the fin plates 6 has at least two opposite side surfaces, a proximate side 61 that is proximate to the base plate 5, a distal side 62 that is opposite to the proximate side 61, and a rib unit. The rib unit includes a plurality of generally straight integral ribs 7 that are formed on the side surfaces of the fin plates 6. Each of the fin plates 6 are generally perpendicular to the heat-dissipating side surface 51 of the base plate 5, and extends from the proximate side 61 to the distal side 62 so as to permit heat transfer along the ribs 7 from the proximate sides 61 to the distal sides 62 and so as to produce a small turbulent flow of air at each of the ribs 7, thereby breaking a temperature boundary layer of the air flowing through each of the channels 8. Because the sizes of the ribs 6 are relatively small with respect to the widths of the channels 8, the cool air can flow smoothly through the channels 8, thereby carrying effectively heat from the fin plates 6.

A thermally conductive straight long spacer plate 92 extends integrally and perpendicularly from a middle portion of the heat-dissipating side surface 51 of the base plate 5 so as to define two generally rectangular half sections 512 of the heat-dissipating side surface 51 on two sides of the long spacer plate 5. Two thermally conductive straight short spacer plates 94 extend respectively, integrally and perpendicularly from middle portions of the half sections 512 of the heat-dissipating side surface 5, and are in thermal communication with the heat-dissipating side surface 51. The short spacer plates 94 are spaced apart from and are perpendicular to the long spacer plate 92 so as to define two generally rectangular quarter sections 514 of the heat-dissipating side surface 51 on two sides of each of the short spacer plates 94.

In this embodiment, the fin plates 6 are formed integrally on the quarter sections 514 of the heat-dissipating side surface 51. Each of the fin plates 6 has two integrally formed plate portions 601, 602, which are respectively parallel to the long spacer plate 92 and the short spacer plates 94 and which are perpendicular to each other so that the proximate and distal sides 61, 62 of the fin plates 6 are generally L-shaped. The plate portions 601, 602 of each of the fin plates 6 define a corner therebetween, which is formed with one of the ribs 7.

Four adjacent pairs of upright intermediate plates 98 are formed integrally on the base plate 5 in order to enable molding of the heat dissipation device. Each adjacent pair of the intermediate plates 98 is disposed on a respective one of the quarter sections 514 of the heat-dissipating side surface 51 between an adjacent pair of the fin plates 6, and is respectively parallel to the long spacer plate 92 and the short spacer plates 94. To facilitate the molding process of the device, each adjacent pair of the intermediate plates 98 are spaced apart from each other at an appropriate distance.

On intermediate portions of some of the fin plates 6, the ribs 7 are symmetrical along the fin plates 6. Each symmetrical pair of the ribs 6 is formed respectively on the opposite sides of one of the fin plates 6, thereby constituting an elongated upright post 77, which extends generally perpendicular from the base plate 5.

Figure 4:
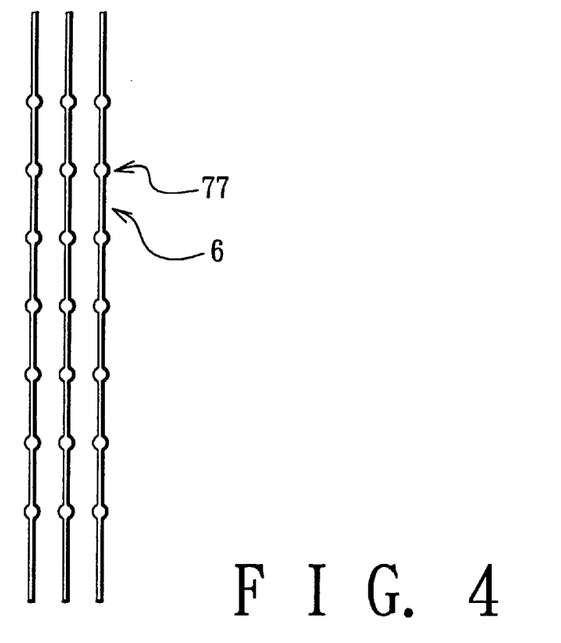
FIGS. 4 through 8 illustrate different arrangements of posts of the heat dissipation device of this invention.
Figure 5:
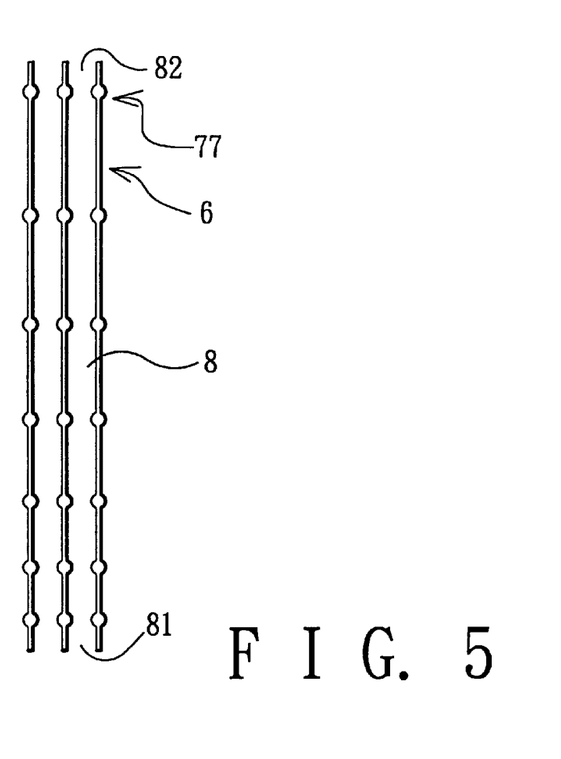
Figure 6:
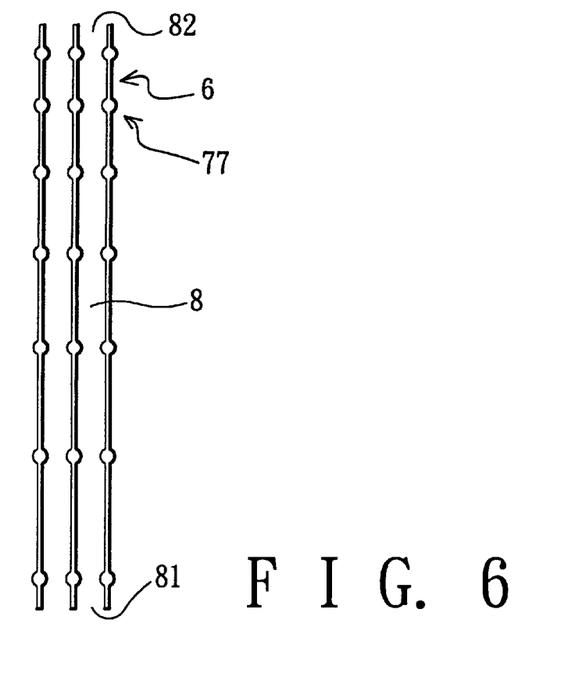
Figure 7:
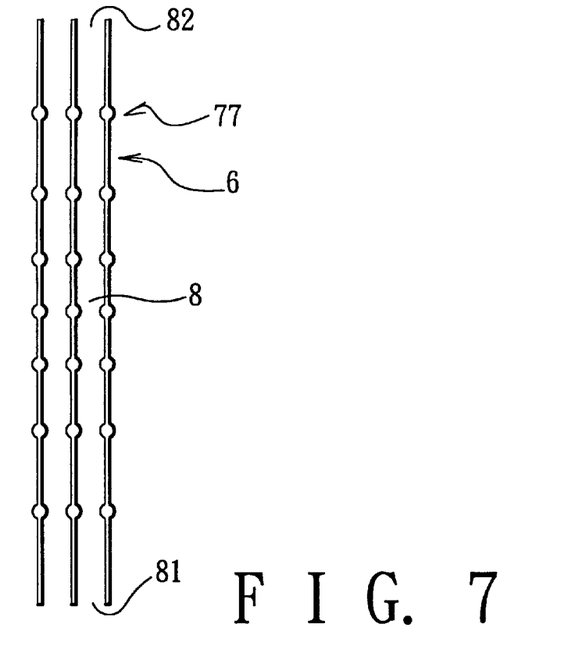
Figure 8:
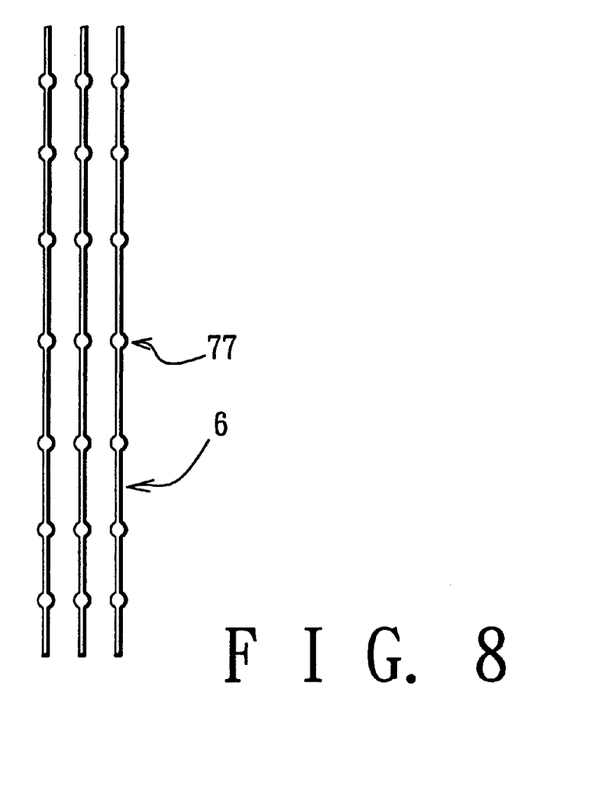

FIGS. 4 through 8 illustrate different arrangements of the posts 66 on the fin plates 6. As illustrated, the fin plates 6 are disposed parallel to each other, and are arranged in a row. Each of the posts 77 has a circular cross-section. The posts 77 on each of the fin plates 6 are aligned respectively with those on remainder of the fin plates 6. In FIG. 4, the posts 77 on each of the fin plates 6 are equidistant. In FIG. 5, each adjacent pair of the posts 77 on each of the fin plates 6 are spaced apart from each other at a distance, which increases gradually from the upstream ends 81 of the channels 8 to the downstream ends 82 of the channels 8. In FIG. 6, each adjacent pair of the posts 77 on each of the fin plates 6 are spaced apart from each other at a distance, which reduces gradually from the upstream ends 81 of the channels 8 to the downstream ends 82 of the channels 8. In FIG. 7, each adjacent pair of the posts 77 on each of the fin plates 6 are spaced apart from each other at a distance, which increases gradually from middles of the channels 8 to the upstream and downstream ends 81, 82 of the channels 8. In FIG. 8, each adjacent pair of the posts 77 on each of the fin plates 6 are spaced apart from each other at a distance, which reduces gradually from middles of the channels 8 to the upstream and downstream ends 81, 82 of the channels 8.

Figure 9:
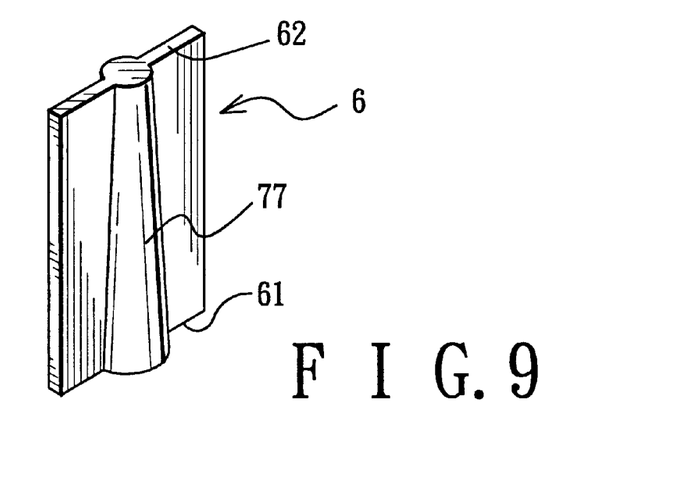
FIGS. 9 through 15 illustrate different shapes of the posts of the heat dissipation device of this invention.
Figure 10:
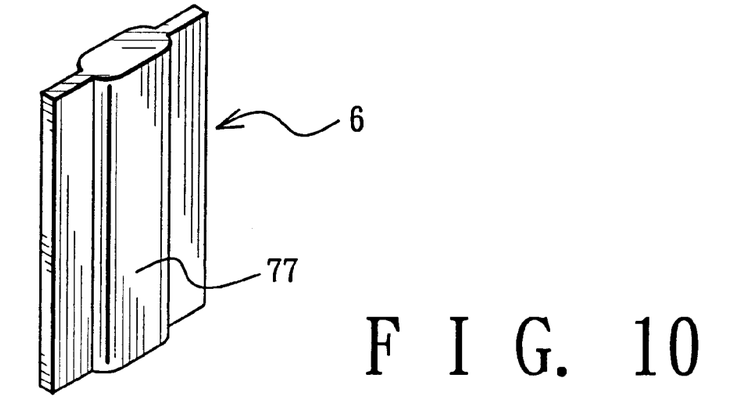
Figure 11:
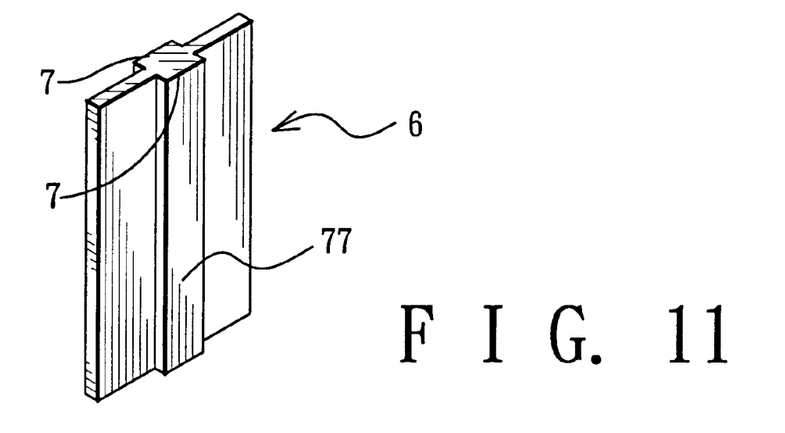
Figure 12:
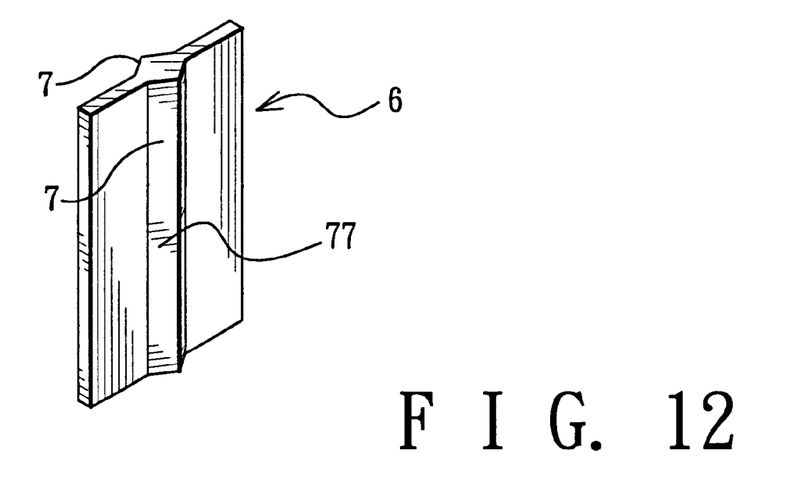
Figure 13:
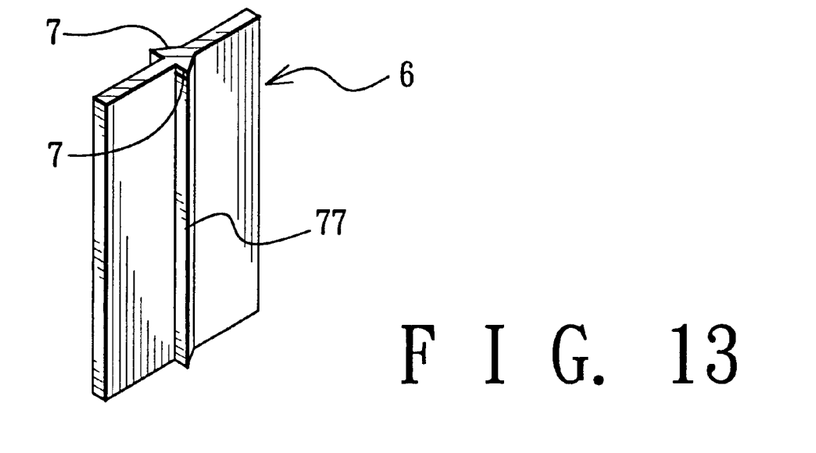
Figure 14:
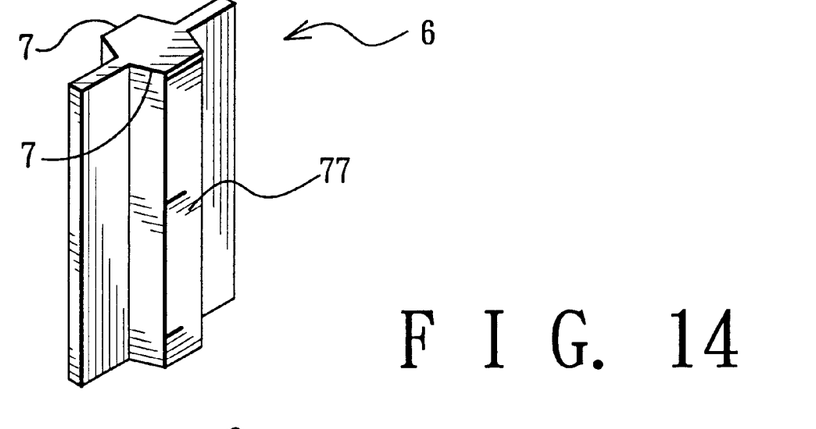
Figure 15:
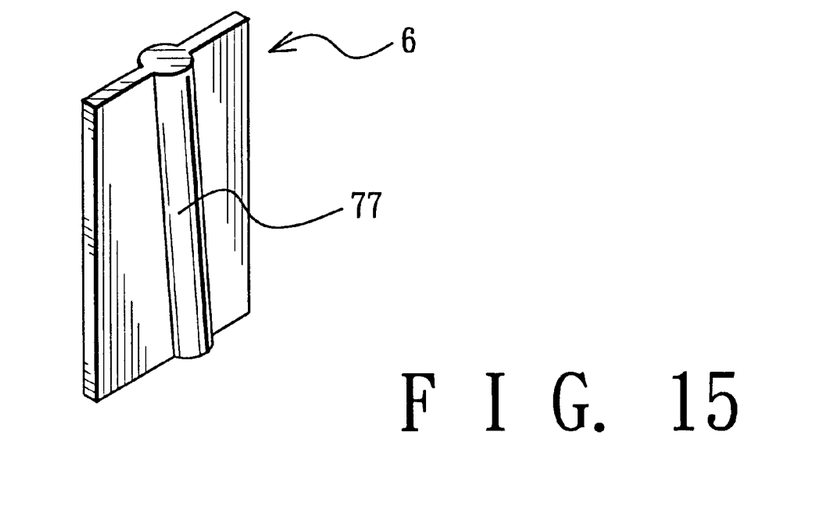

FIGS. 9 through 15 illustrate different shapes of the posts 77. In FIG. 9, the post 77 extends substantially perpendicular from the base plate 5 (see FIG. 3), and is of a circular cross-section, which has a diameter that reduces gradually from the proximate sides 61 of the fin plates 6 to the distal sides 62 of the fin plates 6. In FIG. 10, the post 77 extends substantially perpendicular from the base plate 5 (see FIG. 3), and has an elliptical cross-section. In FIG. 11, the post 77 extends substantially perpendicular from the base plate 5 (see FIG. 3). The cross-sections of the posts 77 and the ribs 7 are rectangular. In FIG. 12, the post 77 extends substantially perpendicular from the base plate 5 (see FIG. 3), and has a rhombic cross-section. Each of the ribs 7 has a triangular cross-section. In FIG. 13, the post 77 extends substantially perpendicular from the base plate 5 (see FIG. 3). The cross-sections of the post 77 and the ribs 7 are triangular. In FIG. 14, the post 77 extends substantially perpendicular from the base plate 5 (see FIG. 3), and has a hexagonal cross-section. Each of the ribs 7 has a trapezoidal cross-section. In FIG. 15, the post 77 is somewhat inclined relative to the base plate 5 (see FIG. 3), and is of a circular cross-section, which has a uniform diameter.

FIGS. 16 through 19 illustrate different arrangements of the fin plates 6.

Figure 16:
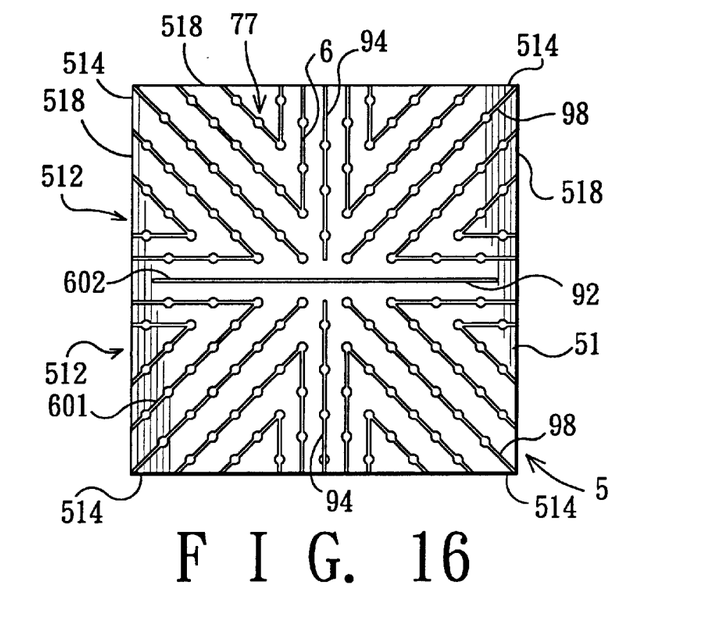
FIGS. 16 through 19 illustrate different arrangements of fin plates of the heat dissipation device of this invention.

In FIG. 16, the device includes eight V-shaped fin plates 6, a thermally conductive straight long spacer plate 92, two thermally conductive straight short spacer plates 94, and two thermally conductive straight medium spacer plates 98.

The long spacer plate 92 extends integrally and perpendicularly from a middle portion of the heat-dissipating side surface 51 of the base plate 5 so as to define two generally rectangular half sections 512 of the heat-dissipating side surface 51 on two sides of the long spacer plate 92.

The short spacer plates 94 extend respectively, integrally and perpendicularly from middle portions of the half sections 512 of the heat-dissipating side surface 51, and are spaced apart from and are perpendicular to the long spacer plate 92 so as to define two generally rectangular quarter sections 514 of the heat-dissipating side surface 51 on two sides of each of the short spacer plates 94.

The medium spacer plates 98 extend respectively, integrally and perpendicularly from middle portions of the quarter sections 514 of the heat-dissipating side surface 51, and are spaced apart from and are inclined relative to the long and short spacer plates 92, 94 so as to define two generally triangular octant sections 518 of the heat-dissipating side surface 51 on two sides of each of the medium spacer plates 98.

The fin plates 6 are formed integrally on the octant sections 518 of the heat-dissipating side surface 51. Each of the fin plates 6 has two integrally formed plate portions 601, 602, which are respectively parallel to one of the medium spacer plates 98 and one of the long and short spacer plates 92, 94 and which are inclined relative to each other. The plate portions 601, 602 of each of the fin plates 6 define a corner therebetween, which is formed with one of the posts 77.

Figure 17:
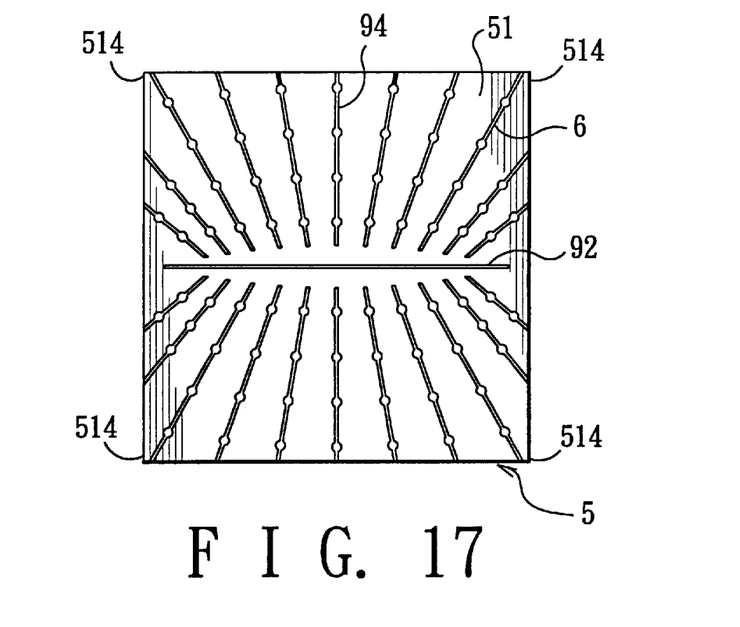

In FIG. 17, the device includes a plurality of fin plates 6, a thermally conductive straight long spacer plate 92, and two thermally conductive straight short spacer plates 94. The long and short spacer plates 92, 94 are similar to those in the embodiment shown in FIG. 16 in construction. Each of the fin plates 6 extends integrally on one of the quarter sections 514 of the heat-dissipating side surface 51 in a generally radial direction, and is spaced apart from the long and short spacer plates 92, 94.

Figure 18:
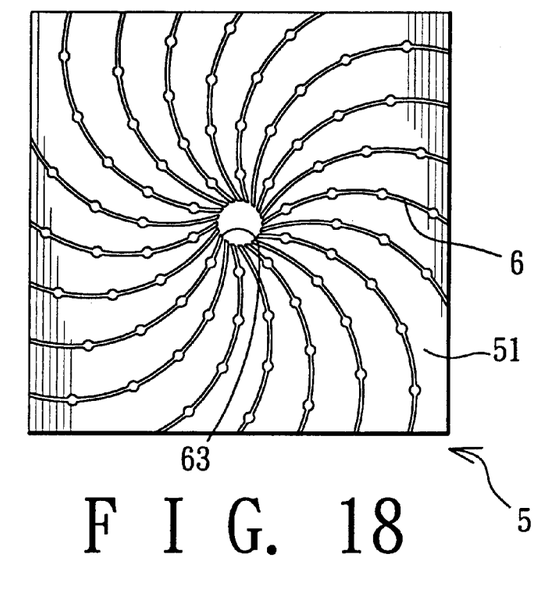

In FIG. 18, the fin plates 6 extend integrally on the heat-dissipating side surface 51 of the base plate 5 in generally spiral directions, and have inner ends 63, which are arranged in a circle that is located at a center of the base plate 5.

Figure 19:
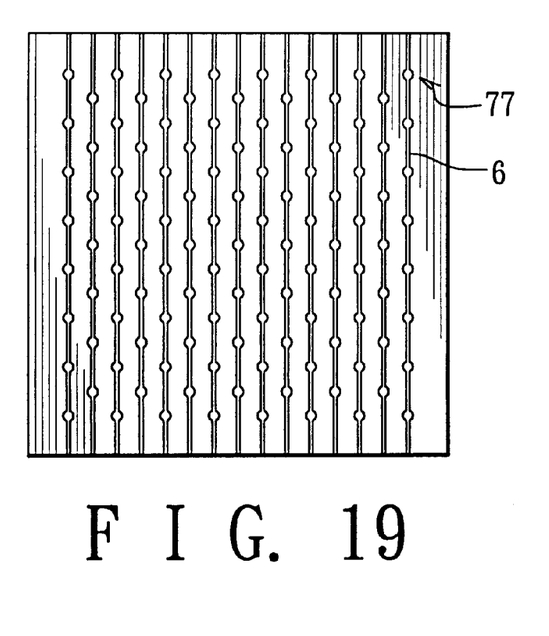

In FIG. 19, the fin plates 6 are disposed parallel to each other, and are arranged in a row. Unlike the embodiment shown in FIG. 3, the posts 77 on each adjacent pair of the fin plates 6 are staggered. Each of the posts 77 has a rhombic cross-section.

With this invention thus explained, it is apparent that numerous modifications and variations can be made without departing from the scope and spirit of this invention. It is therefore intended that this invention be limited only as indicated by the appended claims.

I claim:

1. A heat dissipation device comprising:

a thermally conductive base plate having a heat-accepting side surface that is adapted to abut against a heat generating member of an electronic device and that is adapted to be in thermal communication with the heat generating member, and a heat-dissipating side surface;

a plurality of thermally conductive fin plates extending perpendicularly from and being in thermal communication with said heat-dissipating side surface of said base plate, each adjacent pair of said fin plates defining a channel therebetween, which is adapted to permit flow of cool air therethrough and which has an upstream end for introduction of the cool air, and a downstream end for discharge of the cool air, each of said fin plates having two opposite side surfaces, a proximate side that is proximate to said base plate, a distal side that is opposite to said proximate side, and a rib unit, which includes a plurality of generally straight integral ribs that are formed on said side surfaces of said fin plates, each of said fin plates being generally perpendicular to said heat-dissipating side surface of said base plate and extending from said proximate side to said distal side so as to permit transfer of a portion of heat from said base plate along said ribs from said proximate sides to said distal sides and so as to produce a turbulent flow of air at each of said ribs, thereby breaking a temperature boundary layer of the air flowing through each of said channels;

a thermally conductive straight long spacer plate extending integrally and perpendicularly from and being in thermal communication with a middle portion of said heat-dissipating side surface of said base plate so as to define two generally rectangular half sections of said heat-dissipating side surface on two sides of said long spacer plate;

two thermally conductive straight short spacer plates extending respectively, integrally and perpendicularly from and being in thermal communication with middle portions of said half sections of said heat-dissipating side surface, said short spacer plates being spaced apart from and being perpendicular to said long spacer plate so as to define two generally rectangular quarter sections of said heat-dissipating side surface on two sides of each of said short spacer plates;

said fin plates being formed integrally on said quarter sections of said heat-dissipating side surface and having two integrally formed plate portions, which are respectively parallel to said long spacer plate and said short spacer plates and which are perpendicular to each other so that said proximate and distal sides of said fin plates are generally L-shaped, said plate portions of each of said fin plates defining a corner therebetween, which is formed with one of said ribs; and four adjacent pairs of intermediate plates, each of said adjacent pairs of which is disposed on a respective one of said quarter sections of said heat-dissipating side surface between an adjacent pair of said fin plates, each of said adjacent pairs of said intermediate plates being respectively parallel to said long spacer plate and said short spacer plates and being spaced apart from each other.

2. The heat dissipation device as claimed in claim 1, wherein said ribs are symmetrical along said fin plates, each symmetrical pair of said ribs being formed respectively on said opposite sides of one of said fin plates, thereby constituting an elongated upright post, which extends generally perpendicular from said base plate.

3. The heat dissipation device as claimed in claim 2, wherein said fin plates are disposed parallel to each other, and are arranged in a row, each of said posts having a circular cross-section, said posts on each of said fin plates being aligned respectively with said posts on the remainder of said fin plates.

4. The heat dissipation device as claimed in claim 2, wherein said posts on each of said fin plates are equidistant.

5. The heat dissipation device as claimed in claim 2, wherein each of said posts extends substantially perpendicular from said base plate, and is of a circular cross-section, which has a diameter that reduces gradually from said proximate sides of said fin plates to said distal sides of said fin plates.

6. The heat dissipation device as claimed in claim 2, wherein each of said posts extends substantially perpendicular from said base plate, and has an elliptical cross-section.

7. The heat dissipation device as claimed in claim 2, wherein said posts extend substantially perpendicular from said base plate, the cross-sections of said posts and said ribs being rectangular.

8. The heat dissipation device as claimed in claim 2, wherein each of said posts extends substantially perpendicular from said base plate, and has a rhombic cross-section, each of said ribs having a triangular cross-section.

9. The heat dissipation device as claimed in claim 2, wherein said posts extend substantially perpendicular from said base plate, the cross-sections of said posts and said ribs being triangular.

10. The heat dissipation device as claimed in claim 2, wherein said posts extend substantially perpendicular from said base plate, and has a hexagonal cross-section, each of said ribs having a trapezoidal cross-section.

11. The heat dissipation device as claimed in claim 2, wherein said fin plates extend integrally on said heat-dissipating side surface of said base plate in generally spiral directions, and have inner ends, which are arranged in a circle that is located at a center of said base plate.

12. The heat dissipation device as claimed in claim 2, wherein said fin plates are disposed parallel to each other, and are arranged in a row, said posts on each adjacent pair of said fin plates being staggered.

13. The heat dissipation device as claimed in claim 2, wherein each of said posts has a rhombic cross-section.

14. A heat dissipation device comprising:

a thermally conductive base plate having a heat-accepting side surface that is adapted to abut against a heat generating member of an electronic device and that is adapted to be in thermal communication with the heat generating member, and a heat-dissipating side surface; and a plurality of thermally conductive fin plates extending perpendicularly from and being in thermal communication with said heat-dissipating side surface of said base plate, each adjacent pair of said fin plates defining a channel therebetween, which is adapted to permit flow of cool air therethrough and which has an upstream end for introduction of the cool air, and a downstream end for discharge of the cool air, each of said fin plates having two opposite side surfaces, a proximate side that is proximate to said base plate, a distal side that is opposite to said proximate side, and a rib unit, which includes a plurality of generally straight integral ribs that are formed on said side surfaces of said fin plates, each of said fin plates being generally perpendicular to said heat-dissipating side surface of said base plate and extending from said proximate side to said distal side so as to permit transfer of a portion of heat from said base plate along said ribs from said proximate sides to said distal sides and so as to produce a turbulent flow of air at each of said ribs, thereby breaking a temperature boundary layer of the air flowing through each of said channels, said ribs being symmetrical along said fin plates, each symmetrical pair of said ribs being formed respectively on said opposite sides of one of said fin plates, thereby constituting an elongated upright post, which extends generally perpendicular from said base plate, wherein each adjacent pair of said posts on each of said fin plates are spaced apart from each other at a distance, which increases gradually from said upstream ends of said channels to said downstream ends of said channels.

15. A heat dissipation device comprising:

a thermally conductive base plate having a heat-accepting side surface that is adapted to abut against a heat generating member of an electronic device and that is adapted to be in thermal communication with the heat generating member, and a heat-dissipating side surface; and a plurality of thermally conductive fin plates extending perpendicularly from and being in thermal communication with said heat-dissipating side surface of said base plate, each adjacent pair of said fin plates defining a channel therebetween, which is adapted to permit flow of cool air therethrough and which has an upstream end for introduction of the cool air, and a downstream end for discharge of the cool air, each of said fin plates having two opposite side surfaces, a proximate side that is proximate to said base plate, a distal side that is opposite to said proximate side, and a rib unit, which includes a plurality of generally straight integral ribs that are formed on said side surfaces of said fin plates, each of said fin plates being generally perpendicular to said heat-dissipating side surface of said base plate and extending from said proximate side to said distal side so as to permit transfer of a portion of heat from said base plate along said ribs from said proximate sides to said distal sides and so as to produce a turbulent flow of air at each of said ribs, thereby breaking a temperature boundary layer of the air flowing through each of said channels, said ribs being symmetrical along said fin plates, each symmetrical pair of said ribs being formed respectively on said opposite sides of one of said fin plates, thereby constituting an elongated upright post, which extends generally perpendicular from said base plate, wherein each adjacent pair of said posts on each of said fin plates are spaced apart from each other at a distance, which reduces gradually from said upstream ends of said channels to said downstream ends of said channels.

16. A heat dissipation device comprising:

a thermally conductive base plate having a heat-accepting side surface that is adapted to abut against a heat generating member of an electronic device and that is adapted to be in thermal communication with the heat generating member, and a heat-dissipating side surface; and a plurality of thermally conductive fin plates extending perpendicularly from and being in thermal communication with said heat-dissipating side surface of said base plate, each adjacent pair of said fin plates defining a channel therebetween, which is adapted to permit flow of cool air therethrough and which has an upstream end for introduction of the cool air, and a downstream end for discharge of the cool air, each of said fin plates having two opposite side surfaces, a proximate side that is proximate to said base plate, a distal side that is opposite to said proximate side, and a rib unit, which includes a plurality of generally straight integral ribs that are formed on said side surfaces of said fin plates, each of said fin plates being generally perpendicular to said heat-dissipating side surface of said base plate and extending from said proximate side to said distal side so as to permit transfer of a portion of heat from said base plate along said ribs from said proximate sides to said distal sides and so as to produce a turbulent flow of air at each of said ribs, thereby breaking a temperature boundary layer of the air flowing through each of said channels, said ribs being symmetrical along said fin plates, each symmetrical pair of said ribs being formed respectively on said opposite sides of one of said fin plates, thereby constituting an elongated upright post, which extends generally perpendicular from said base plate, wherein each adjacent pair of said posts on each of said fin plates are spaced apart from each other at a distance, which increases gradually from middles of said channels to said upstream and downstream ends of said channels.

17. A heat dissipation device comprising:

a thermally conductive base plate having a heat-accepting side surface that is adapted to abut against a heat generating member of an electronic device and that is adapted to be in thermal communication with the heat generating member, and a heat-dissipating side surface; and a plurality of thermally conductive fin plates extending perpendicularly from and being in thermal communication with said heat-dissipating side surface of said base plate, each adjacent pair of said fin plates defining a channel therebetween, which is adapted to permit flow of cool air therethrough and which has an upstream end for introduction of the cool air, and a downstream end for discharge of the cool air, each of said fin plates having two opposite side surfaces, a proximate side that is proximate to said base plate, a distal side that is opposite to said proximate side, and a rib unit, which includes a plurality of generally straight integral ribs that are formed on said side surfaces of said fin plates, each of said fin plates being generally perpendicular to said heat-dissipating side surface of said base plate and extending from said proximate side to said distal side so as to permit transfer of a portion of heat from said base plate along said ribs from said proximate sides to said distal sides and so as to produce a turbulent flow of air at each of said ribs, thereby breaking a temperature boundary layer of the air flowing through each of said channels, said ribs being symmetrical along said fin plates, each symmetrical pair of said ribs being formed respectively on said opposite sides of one of said fin plates, thereby constituting an elongated upright post, which extends generally perpendicular from said base plate, wherein each adjacent pair of said posts on each of said fin plates are spaced apart from each other at a distance, which reduces gradually from middles of said channels to said upstream and downstream ends of said channels.

18. A heat dissipation device comprising:

a thermally conductive base plate having a heat-accepting side surface that is adapted to abut against a heat generating member of an electronic device and that is adapted to be in thermal communication with the heat generating member, and a heat-dissipating side surface; and a plurality of thermally conductive fin plates extending perpendicularly from and being in thermal communication with said heat-dissipating side surface of said base plate, each adjacent pair of said fin plates defining a channel therebetween, which is adapted to permit flow of cool air therethrough and which has an upstream end for introduction of the cool air, and a downstream end for discharge of the cool air, each of said fin plates having two opposite side surfaces, a proximate side that is proximate to said base plate, a distal side that is opposite to said proximate side, and a rib unit, which includes a plurality of generally straight integral ribs that are formed on said side surfaces of said fin plates, each of said fin plates being generally perpendicular to said heat-dissipating side surface of said base plate and extending from said proximate side to said distal side so as to permit transfer of a portion of heat from said base plate along said ribs from said proximate sides to said distal sides and so as to produce a turbulent flow of air at each of said ribs, thereby breaking a temperature boundary layer of the air flowing through each of said channels, said ribs being symmetrical along said fin plates, each symmetrical pair of said ribs being formed respectively on said opposite sides of one of said fin plates, thereby constituting an elongated upright post, which extends generally perpendicular from said base plate, wherein each of said posts is somewhat inclined relative to said base plate, and is of a circular cross-section, which has a uniform diameter.

19. A heat dissipation device comprising:

a thermally conductive base plate having a heat-accepting side surface that is adapted to abut against a heat generating member of an electronic device and that is adapted to be in thermal communication with the heat generating member, and a heat-dissipating side surface;

a plurality of thermally conductive fin plates extending perpendicularly from and being in thermal communication with said heat-dissipating side surface of said base plate, each adjacent pair of said fin plates defining a channel therebetween, which is adapted to permit flow of cool air therethrough and which has an upstream end for introduction of the cool air, and a downstream end for discharge of the cool air, each of said fin plates having two opposite side surfaces, a proximate side that is proximate to said base plate, a distal side that is opposite to said proximate side, and a rib unit, which includes a plurality of generally straight integral ribs that are formed on said side surfaces of said fin plates, each of said fin plates being generally perpendicular to said heat-dissipating side surface of said base plate and extending from said proximate side to said distal side so as to permit transfer of a portion of heat from said base plate along said ribs from said proximate sides to said distal sides and so as to produce a turbulent flow of air at each of said ribs, thereby breaking a temperature boundary layer of the air flowing through each of said channels, said ribs being symmetrical along said fin plates, each symmetrical pair of said ribs being formed respectively on said opposite sides of one of said fin plates, thereby constituting an elongated upright post, which extends generally perpendicular from said base plate;

a thermally conductive straight long spacer plate extending integrally and perpendicularly from and being in thermal communication with a middle portion of said heat-dissipating side surface of said base plate so as to define two generally rectangular half sections of said heat-dissipating side surface on two sides of said long spacer plate;

two thermally conductive straight short spacer plates extending respectively, integrally and perpendicularly from and being in thermal communication with middle portions of said half sections of said heat-dissipating side surface, said short spacer plates being spaced apart from and being perpendicular to said long spacer plate so as to define two generally rectangular quarter sections of said heat-dissipating side surface on two sides of each of said short spacer plates; and two thermally conductive straight medium spacer plates extending respectively, integrally and perpendicularly from and being in thermal communication with middle portions of said quarter sections of said heat-dissipating side surface, said medium spacer plates being spaced apart from and being inclined relative to said long and short spacer plates so as to define two generally triangular octant sections of said heat-dissipating side surface on two sides of each of said medium spacer plates;

said fin plates being formed integrally on said octant sections of said heat-dissipating side surface and having two integrally formed plate portions, which are respectively parallel to one of said medium spacer plates and one of said long and short spacer plates and which are inclined relative to each other so that said proximate and distal sides of said fin plates are generally V-shaped, said plate portions of each of said fin plates defining a corner therebetween, which is formed with one of said posts.

20. A heat dissipation device comprising:

a thermally conductive base plate having a heat-accepting side surface that is adapted to abut against a heat generating member of an electronic device and that is adapted to be in thermal communication with the heat generating member, and a heat-dissipating side surface;

a plurality of thermally conductive fin plates extending perpendicularly from and being in thermal communication with said heat-dissipating side surface of said base plate, each adjacent pair of said fin plates defining a channel therebetween, which is adapted to permit flow of cool air therethrough and which has an upstream end for introduction of the cool air, and a downstream end for discharge of the cool air, each of said fin plates having two opposite side surfaces, a proximate side that is proximate to said base plate, a distal side that is opposite to said proximate side, and a rib unit, which includes a plurality of generally straight integral ribs that are formed on said side surfaces of said fin plates, each of said fin plates being generally perpendicular to said heat-dissipating side surface of said base plate and extending from said proximate side to said distal side so as to permit transfer of a portion of heat from said base plate along said ribs from said proximate sides to said distal sides and so as to produce a turbulent flow of air at each of said ribs, thereby breaking a temperature boundary layer of the air flowing through each of said channels, said ribs being symmetrical along said fin plates, each symmetrical pair of said ribs being formed respectively on said opposite sides of one of said fin plates, thereby constituting an elongated upright post, which extends generally perpendicular from said base plate;

a thermally conductive straight long spacer plate extending integrally and perpendicularly from and being in thermal communication with a middle portion of said heat-dissipating side surface of said base plate so as to define two generally rectangular half sections of said heat-dissipating side surface on two sides of said long spacer plate; and two thermally conductive straight short spacer plates extending respectively, integrally and perpendicularly from and being in thermal communication with middle portions of said half sections of said heat-dissipating side surface, said short spacer plates being spaced apart from and being perpendicular to said long spacer plate so as to define two generally rectangular quarter sections of said heat-dissipating side surface on two sides of each of said short spacer plates; each of said fin plates extending integrally on said quarter sections of said heat-dissipating side surface in a generally radial direction, and being spaced apart from said long and short spacer plates.

* * * * *